United States Patent
Chiang et al.

(10) Patent No.: US 8,836,207 B2
(45) Date of Patent: Sep. 16, 2014

(54) FLUORESCENT LAYER AND ITS PREPARATION METHOD AND USES

(75) Inventors: Te-Hsin Chiang, New Taipei (TW); Ru-Shi Liu, New Taipei (TW); Der-Shing Chiang, New Taipei (TW); Chang-Yang Chiang, New Taipei (TW)

(73) Assignee: Bell Ceramics Co., Ltd., New Taipei (TW)

( * ) Notice: Subject to any disclaimer, the term of this patent is extended or adjusted under 35 U.S.C. 154(b) by 0 days.

(21) Appl. No.: 13/523,190

(22) Filed: Jun. 14, 2012

(65) Prior Publication Data

US 2013/0015759 A1    Jan. 17, 2013

(30) Foreign Application Priority Data

Jul. 12, 2011  (TW) .............................. 100124605 A
Mar. 30, 2012 (TW) .............................. 101111384 A

(51) Int. Cl.
| | | |
|---|---|---|
| *C09K 11/80* | (2006.01) | |
| *C09K 11/59* | (2006.01) | |
| *C09K 11/02* | (2006.01) | |

(52) U.S. Cl.
CPC ................................... *C09K 11/025* (2013.01)
USPC .............. 313/498; 252/301.4 F; 252/301.4 R; 252/301.4 H

(58) Field of Classification Search
USPC ............. 313/498–512; 252/301.4 R, 301.4 F, 252/301.4 H, 301.4 P; 428/220, 690
See application file for complete search history.

(56) References Cited

U.S. PATENT DOCUMENTS

| | | | |
|---|---|---|---|
| 7,361,938 B2 | 4/2008 | Mueller et al. | ................... 257/94 |
| 2008/0187746 A1 | 8/2008 | De Graaf et al. | |
| 2009/0002810 A1 | 1/2009 | Jeon et al. | |
| 2011/0279012 A1* | 11/2011 | Washizu et al. | ............... 313/483 |
| 2012/0045634 A1 | 2/2012 | Irie et al. | |

FOREIGN PATENT DOCUMENTS

| | | |
|---|---|---|
| CN | 101696085 A | 4/2010 |
| JP | 2003258308 A | 9/2003 |
| JP | 2008143978 A | 6/2008 |
| JP | 2008533270 A | 8/2008 |
| JP | 2009524235 A | 6/2009 |
| JP | 201112215 A | 1/2011 |
| JP | 201262459 A | 3/2012 |
| TW | M401206 U1 | 4/2011 |

* cited by examiner

*Primary Examiner* — Elmito Breval
(74) *Attorney, Agent, or Firm* — Michael W. Ferrell; Ferrells, PLLC; Anna L. Kinney

(57) ABSTRACT

A fluorescent layer, its preparation method and uses are provided. The fluorescent layer is provided from a fluorescent material and a calcining material. The fluorescent material is in an amount ranging from about 5 wt % to about 95 wt % based on the total weight of the fluorescent layer. The fluorescent layer of the present invention can be used in a light-emitting diode to change the color of emitting-light and improve the heat dissipation of the light-emitting diode. Furthermore, the fluorescent layer of the present invention is free of an organic resin, and thus, does not have the problem of aging (etiolation). The final product has a stable, lasting and durable luminescent quality.

6 Claims, 3 Drawing Sheets
(1 of 3 Drawing Sheet(s) Filed in Color)

FLUORESCENT LAYER AND ITS PREPARATION METHOD AND USES

CLAIM FOR PRIORITY

This application claims the benefit of Taiwan Patent Application No. 100124605, filed Jul. 12, 2011, and Taiwan Patent Application No. 101111384, filed Mar. 30, 2012, the subject matters of which are incorporated herein by reference.

CROSS-REFERENCES TO RELATED APPLICATIONS

Not applicable.

BACKGROUND OF THE INVENTION

1. Field of the Invention

The present invention relates to a fluorescent layer and its preparation method and uses. In particular, the present invention relates to a fluorescent layer useful in light emitting diodes and its preparation method.

2. Descriptions of the Related Art

With the awareness of saving energy and protecting the environment, white light emitting diodes (LEDs) have become the most anticipated emerging product and have gradually replaced traditional lighting equipments because of advantages including a smaller size (in response to the trend of miniaturization), low power consumption (one eighth to one tenth of conventional light bulbs, and half of fluorescent lamps), a long lifespan (more than 100,000 hours), low heat generation (low heat radiation), and excellent response time (capable of high frequency operation). White LEDs can solve many problems that incandescent bulbs could not solve, and thus, have become a new hope of lighting in the $21^{st}$ century. In addition, the white LED is a "green lighting source" because it is both power-saving and eco-friendly.

White LEDs that were developed in the past consisted of a plurality of LEDs with various light emitting wavelengths. However, such a device is limited in application to light emitting devices requiring high luminance due to a large volume, poor luminous efficiency and uneven color mixing. In principle, current white LEDs consist of a single wavelength light source (LED chip) and at least one fluorescent material excitable by the light source. The fluorescence emitted from the excited fluorescent material is mixed with the light emitted from the light source (which is not absorbed by the fluorescent material) to form white light. For the structure of current white LEDs, the fluorescent material is generally mixed with a packaging material such as an epoxy resin to form a package, and then, a light source is covered with the package, i.e., forming a fluorescent layer on the light source to provide the white LED.

Nonetheless, the above light emitting device, when used for a time period, often has the problem of aging (etiolation) because the epoxy resin therein is over-crosslinked due to the absorption of ultraviolet light or heat generated by the diode. This aging problem lowers the luminous efficiency of the light emitting devices significantly. In addition, the fluorescent material in the light emitting layer also has effects such as heat exhaustion or thermal quenching as the temperature increases.

The industry has improved the heat dissipation performance of the light emitting device to lower the extent of heat exhaustion of the fluorescent material and to slow down the aging (etiolation) of the epoxy resin. U.S. Pat. No. 7,361,938 discloses a fluorescent plate member to improve the problem of heat dissipation, wherein the fluorescent plate is prepared directly by thermally pressing YAG fluorescent powders at about 1700° C. The fluorescent plate provided by the foregoing means may prevent the fluorescent resin layer from aging and lower the light scattering, but it requires a large amount of fluorescent material and repeated high temperature thermal treatments, thus, increasing the cost.

Based on the needs mentioned above, the present invention provides another fluorescent layer and the preparation method thereof, which can improve the heat dissipation of LED, and can rid of the aging (etiolation) problem because the fluorescent layer of the present invention is free of an organic resin. The final product exhibits characteristics of stable light emission, a long lifespan and high durability. Moreover, the present invention uses a cheaper calcining powder, which can be sintered at a lower temperature, to reduce the manufacturing cost and lower the process difficulty, thus, overcoming many problems encountered in the prior art.

SUMMARY OF THE INVENTION

An objective of the present invention is to provide a fluorescent layer, comprising a fluorescent material and a calcining material, wherein the fluorescent material is in an amount ranging from about 5 wt % to about 95 wt % based on a total weight of the fluorescent layer.

Another objective of the present invention is to provide a sapphire fluorescent plate, comprising a sapphire substrate and a fluorescent layer as described above on the sapphire substrate.

Still another objective of the present invention is to provide a method for manufacturing a fluorescent layer, comprising mixing a fluorescent material and a calcining material to form a green thin layer, wherein the fluorescent material is used in an amount ranging from about 5 wt % to about 95 wt % based on the total weight of the green thin layer; and performing a thermal treatment on the green thin layer at a temperature around the eutectic point of the calcining material.

Yet another objective of the present invention is to provide a method for manufacturing a sapphire fluorescent plate, comprising providing a sapphire substrate; mixing a fluorescent material and a calcining material to form a green thin layer, wherein the fluorescent material is used in an amount ranging from about 5 wt % to about 95 wt % based on the total weight of the green thin layer; and placing the green thin layer on the sapphire substrate and performing a thermal treatment on the green thin layer and sapphire substrate, wherein the thermal treatment is performed at a temperature around the eutectic point of the calcining material.

Yet still another objective of the present invention is to provide a light emitting device, comprising an excitation light source and a fluorescent layer or a sapphire fluorescent plate as described above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE PREFERRED EMBODIMENT

Hereinafter, some embodiments of the present invention will be described in detail with reference to the appended drawings. However, without departing from the spirit of the present invention, the present invention may be embodied in various embodiments and should not be limited to the embodiments described in the specification and drawings. Furthermore, for clarity, the size of each element and each area may be exaggerated in the appended drawings and not depicted in actual proportion. Unless it is additionally explained, the expressions "a," "the," or the like recited in the specification of the present invention (especially in the claims) should include both the singular and the plural forms.

Figure 1:
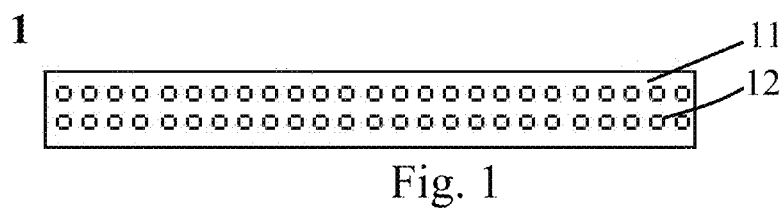
FIG. 1 is a schematic drawing of a fluorescent layer according to one embodiment of the present invention.

FIG. 1 is a schematic drawing of the fluorescent layer according to one embodiment of the present invention. The fluorescent layer 1 comprises a fluorescent material 12 and a calcining material 11. The calcining material 11 is the structural matrix. The fluorescent material 12 is dispersed in the calcining material 11, and preferably dispersed uniformly therein. The phrase "the calcining material 11 is the structural matrix" indicates that the calcining material 11 is the matrix to support the 3D structure of fluorescent layer 1. In addition to the distribution shown in FIG. 1, the fluorescent material 12 may be also dispersed in the calcining material 11 in for example a rhombus stagger or twill manner.

The calcining material useful in the present invention comprises a first component and a second component, wherein the first component may be selected from any suitable transparent ceramic material, for example aluminum oxide ($Al_2O_3$), silicon dioxide ($SiO_2$), and a combination thereof. A combination of aluminum oxide and silicon dioxide is preferred to be used as the first component. The second component is selected to be able to destroy some of the bonding structure of the first component (i.e., ceramic material) to lower the melting point of the first component and then the thermal treatment temperature of the materials, and thus, provides the fluxing effect. The second component comprises barium oxide, and may optionally comprise another substance other than barium oxide for replacing a portion of barium oxide. The other substance may be for example oxides of other alkaline earth metals (i.e., alkaline earth metals other than barium), such as magnesium oxide (MgO), calcium oxide (CaO), strontium oxide (SrO), and any combinations thereof The substitution amount of the other substance may be adjusted by the desired fluxing effect, application of final product and manufacturing cost, and usually does not exceed about 50 mole % of barium oxide. In some embodiments of the present invention, $a(BaO).Al_2O_3.b(SiO_2)$ ($2 \leq a \leq 3$ and $8 \leq b \leq 12$) is used as the calcining material. When the second component of the calcining material further comprises the other substance, the total amount of barium oxide and other substance should allow each component in the calcining material to be in the ratio described above. For example, when the second component consists of barium oxide and calcium oxide, the calcining material may be $a((1-y)BaOyCaO).Al_2O_3.b(SiO_2)$ ($0<y\leq0.5$, $2\leq a\leq3$ and $8\leq b\leq12$), and when the second component consists of barium oxide, calcium oxide and magnesium oxide, the calcining material may be $a((1-w-z)BaO, wCaO, zMgO).Al_2O_3.b(SiO_2)$ ($0<w+z\leq0.5$, $2\leq a\leq3$ and $8\leq b\leq12$), and so on. In the examples below, $a(BaO).Al_2O_3.b(SiO_2)$ ($2\leq a\leq3$ and $9\leq b\leq11$) is used as the calcining material.

Commercially available fluorescent materials, for example, nitrogen oxide fluorescent material, or rare earth garnet fluorescent material, may be used with the calcining material to provide the fluorescent layer in the present invention. According to one embodiment of the present invention, the rare earth garnet fluorescent material, for example $M_{3-x}Al_5O_{12}:Ce_x$ ($0<x\leq0.5$), wherein M is Y, Lu or a combination thereof, is used.

According to Beer's Law, the fluorescence efficiency is determined by the amount of fluorescent material and the thickness of the fluorescent layer, and the desired fluorescence effect may be provided by adjusting the two factors. In the present invention, the fluorescent material is generally in an amount ranging from about 5 wt % to about 95 wt %, preferably about 20 wt % to about 70 wt %, and more preferably about 30 wt % to about 50 wt %, based on the total weight of the fluorescent layer. If the amount of fluorescent material is too low, a sufficient and desirable luminous effect may not be provided, and if the amount is too high, too many pores are generated in the fluorescent layer to influence the luminous efficiency. The thickness of the fluorescent layer is generally controlled to range from about 0.05 mm to about 2 mm, and preferably about 0.2 mm to about 1.5 mm. If the thickness of the fluorescent layer is too thin, the fluorescent layer may be broken easily during preparation, and if the thickness thereof is too thick, it may fail to achieve the need for miniaturization. In addition, in some embodiments of the present invention, a fluorescent layer that is thicker and larger in size may be prepared, and then, the layer is thinned to the desired thickness by grinding and is cut into an appropriate size for later use.

The present invention also provides a method for manufacturing a fluorescent layer, comprising mixing a fluorescent material and a calcining material to form a green thin layer; and performing a thermal treatment on the green thin layer. The species, amounts and variations of the fluorescent material and calcining material useful in the present invention are as described above. Preferably, the fluorescent material is $M_{3-x}Al_5O_{12}:Ce_x$ ($0<x\leq0.5$), wherein M is Y, Lu or a combination thereof and the calcining material is $a(BaO).Al_2O_3.b(SiO_2)$ ($2\leq a\leq3$ and $8\leq b\leq12$). In one embodiment of the present invention, $a(BaO).Al_2O_3.b(SiO_2)$ ($2\leq a\leq3$ and $9\leq b\leq11$) is selected as the calcining material. According to the method of the present invention, the fluorescent material is used in an amount ranging from about 5 wt % to about 95 wt %, preferably about 20 wt % to about 70 wt % and more preferably about 30 wt % to about 50 wt %, based on the total weight of the fluorescent layer.

The method for forming the green thin layer by mixing the calcining material and the fluorescent material is not particularly limited, and the methods of dry pressing or wet slurry forming may also be used. When the wet forming manner is applied, the calculation of the amount of the fluorescent material is based on the dry weight of the green thin layer (i.e., not containing the weight of the solvent or dispersant). In addition, for increasing the structural strength of the green thin layer, a small amount of an adhesive may be added optionally, for example poly(ethylene glycol). Poly(ethylene glycol) can be decomposed and escapes at about 350° C. and will not affect the subsequent processes and characteristics of the product.

The calcining material used in the method of the present invention is not only commercially available, but also prepared through the reaction of precursors. For example, the calcining material may be prepared by providing a precursor mixture, and then performing a thermal treatment on the precursor mixture at a temperature above the thermal decomposition temperature of each component in the precursor mixture, i.e., solid state reaction.

In the above solid state reaction, the precursor mixture comprises a first precursor component and a second precursor component. The first precursor component is selected from a group consisting of aluminum oxide, a precursor of aluminum oxide, silicon dioxide, a precursor of silicon dioxide, and combinations thereof The precursor of aluminum oxide refers to one that can provide aluminum oxide by heating, such as aluminum-containing hydroxides, aluminum-containing organic acid salts, or aluminum-containing inorganic acid salts; specific examples include aluminum hydroxide, aluminum citrate, aluminum acetate, aluminum nitrate, and aluminum carbonate. The precursor of silicon dioxide refers to one that can provide silicon dioxide by heating, such as silanes; specific examples include tetraethoxysilane (TEOS) and dimethoxydimethylsilane. The second precursor component comprises a precursor of barium oxide that can be provided by heating, such as barium hydroxide, barium citrate, barium acetate, barium nitrate, and barium carbonate. In some embodiments, the second precursor component further comprises a precursor of another substance, such as the precursor of an oxide of other alkaline earth metals (i.e., the one other than barium). The precursor of an oxide of other alkaline earth metals refers one that can form an oxide of alkaline earth metal by heating, such as alkaline earth metal-containing hydroxides, alkaline earth metal-containing organic acid salts, or alkaline earth metal-containing inorganic acid salts, and the specific examples are such as strontium hydroxide, calcium hydroxide, strontium citrate, calcium citrate, strontium acetate, calcium acetate, strontium nitrate, calcium nitrate, strontium carbonate, and calcium carbonate. In some embodiments of the present invention, the first precursor component comprises aluminum oxide and silicon dioxide, while the second precursor component is barium carbonate. The composition and amount of the precursor mixture used in the present invention are basically determined by the desired calcining material, and the illustration and variations thereof are as described above.

After obtaining the precursor mixture, a thermal treatment is performed on the precursor mixture at a temperature above the thermal decomposition temperature of each component in the precursor mixture (i.e., the first component and the second component) to obtain a calcining material. The "thermal decomposition temperature" refers to the lowest temperature allowing for each precursor component to be reacted under heat to form a ceramic phase which is stable at a high temperature and generally in oxide form. For example, when the precursor component is barium carbonate, the thermal decomposition temperature is the temperature in which barium carbonate is thermally decomposed to barium oxide. If the precursor component is already in a stable ceramic phase at high temperature, for example aluminum oxide, its thermal decomposition temperature can be neglected. Persons with ordinary skill in the art, after reviewing the context herein, may select an appropriate condition for performing a thermal treatment on the precursor mixture based on their knowledge and the species of the precursor component. For example, the thermal treatment may be performed on the precursor mixture in an air atmosphere at a temperature ranging from about 750° C. to about 950° C.

According to the method for manufacturing a fluorescent layer of the present invention, after obtaining a green thin layer, a fluorescent layer is obtained by performing a thermal treatment on the green thin layer; wherein the thermal treatment is performed at a temperature around the eutectic point of the calcining material. In other words, the temperature of the thermal treatment performed on the green thin layer depending on the calcining material used. Taking costs into account, the thermal treatment is preferably performed in an air atmosphere or a reducing atmosphere at a temperature lower than about 1500° C. For example, when a(BaO).Al$_2$O$_3$.b(SiO$_2$) ($2 \leq a \leq 3$ and $9 \leq b \leq 11$) is used as the calcining material, the thermal treatment may be performed on the green thin layer in an air atmosphere at a temperature ranging from about 1000° C. to about 1300° C., and preferably ranging from about 1100° C. to about 1200° C.

In the fluorescent layer of the present invention, the calcining material replaces the conventional resin material and is used to package the fluorescent material, so the decreasing of luminous efficiency and aging (etiolation) of the resin layer can be prevented. Based on considerations for improving heat dissipation efficiency of the fluorescent layer or preventing crack of the fluorescent layer by heat stress, the fluorescent layer of the present invention may be applied in combination with a heat dissipation substrate.

Figure 2:
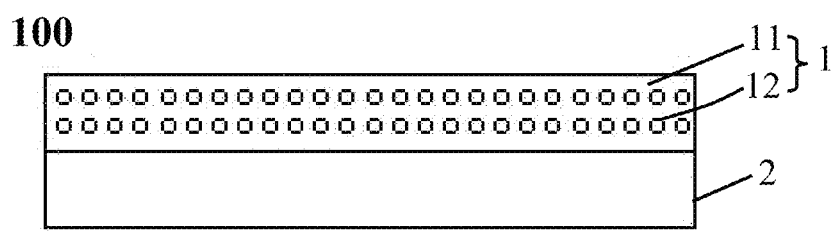
FIG. 2 is a schematic drawing of a sapphire fluorescent plate according to one embodiment of the present invention.

Therefore, the present invention further provides a sapphire fluorescent plate. FIG. 2 shows a schematic drawing of a sapphire fluorescent plate according to one embodiment of the present invention. A sapphire fluorescent plate 100 comprises a sapphire substrate 2 and a fluorescent layer 1 on the sapphire substrate 2.

A sapphire (aluminum oxide) thin plate is used as the substrate of the fluorescent plate of the present invention. The sapphire substrate has a heat conductivity coefficient of about 30 W/m·K to 40 W/m·K, and thus, can improve both the heat dissipation and light conversion of the applied light emitting device. Also, the sapphire substrate has a heat expansion coefficient of $5.8 \times 10^{-6}$/K which is equal to a common diode material (for example, $5.8 \times 10^{-6}$/K for a gallium nitride diode), and is more capable of preventing crack by heat stress during usage. Any commercial sapphire substrate may be used in the present invention. Taking costs into account, the thickness of the sapphire substrate is preferably about 0.2 mm to 2 mm, more preferably about 0.3 mm to about 0.6 mm.

In another aspect, the present invention also provides a method for manufacturing a sapphire fluorescent plate, comprising providing a sapphire substrate; providing a green thin layer using the steps in the method for manufacturing the fluorescent layer as described above; and placing the green thin layer on the sapphire substrate and performing a thermal treatment on the green thin layer and the sapphire substrate, wherein the thermal treatment is performed at a temperature around the eutectic point of the calcining material.

The sapphire substrate used in the method of the present invention, as described above, preferably has a thickness ranging from about 0.2 mm to about 2 mm, and more preferably, ranging from about 0.3 mm to about 0.6 mm.

After providing the sapphire substrate and the green thin layer, a thermal treatment is performed to connect both components. The green thin layer is placed on the sapphire substrate and a thermal treatment is performed on the green thin layer and the sapphire substrate at a temperature around the eutectic point of the calcining material to melt the partial surface of green thin layer and to connect the green thin layer with the sapphire substrate. The thermal treatment temperature generally depends on the calcining material. Taking costs into account, the thermal treatment is preferably performed in an air atmosphere or a reducing atmosphere at a temperature lower than about 1500° C. For example, in the case using a(BaO).$Al_2O_3$.b($SiO_2$) ($2 \leq a \leq 3$ and $9 \leq b \leq 11$) as the calcining material, the thermal treatment on the sapphire substrate and the green thin layer may be performed in an air atmosphere at a temperature ranging from about 1000° C. to about 1300° C., and preferably at a temperature ranging from about 1200° C. to about 1300° C.

Figure 3:
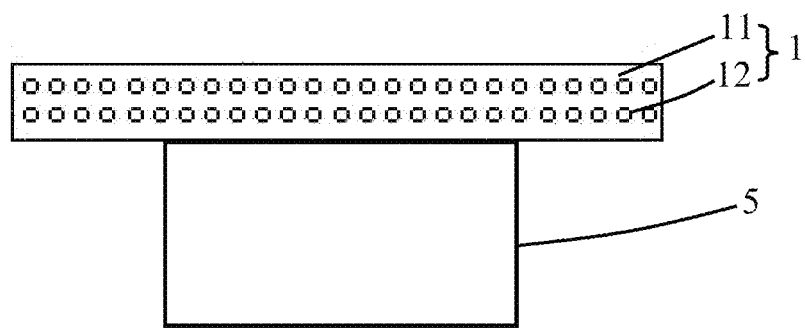
FIG. 3 is a schematic drawing of a light emitting device according to one embodiment of the present invention.
Figure 4:
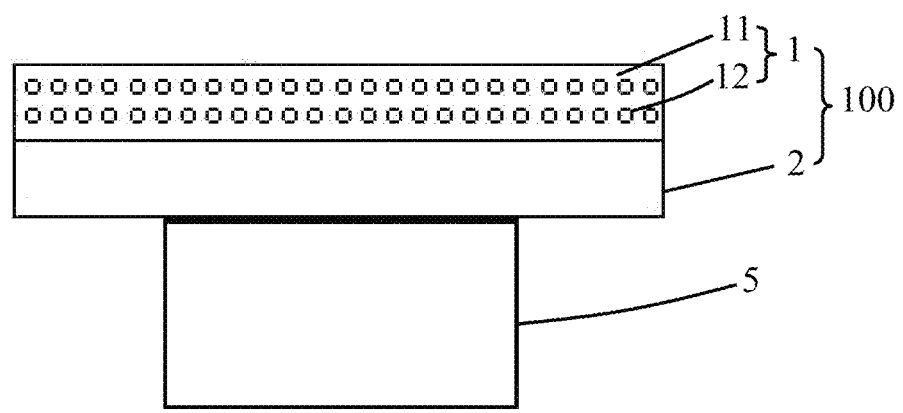
FIG. 4 is a schematic drawing of a light emitting device according to another embodiment of the present invention.

The present invention also provides a light emitting device, comprising an excitation light source, and a fluorescent layer or a sapphire fluorescent plate as described above. FIG. 3 is a schematic drawing of a light emitting device 200 according to one embodiment of the present invention, wherein an excitation light source 5 is connected with a fluorescent layer 1. FIG. 4 is a schematic drawing of a light emitting device 201 according to another embodiment of the present invention, wherein an excitation light source 5 is connected with a sapphire fluorescent plate 100.

In the light emitting device of the present invention, the wavelength of the light emitted from the excitation light source should be coordinated with the fluorescent material in the fluorescent layer; namely, the wavelength of the light emitted from the excitation light source should be capable of exciting the fluorescent material in the fluorescent layer, and the light emitted from the excitation light source can be mixed with a fluorescence emitted by the excited fluorescent material to become white light. The excitation light source is preferred to be blue light or an ultraviolet emitting diode (including a laser diode), which can excite most of the fluorescent materials. For example, a blue light excitation light source in combination with a YAG fluorescent material-containing fluorescent layer can emit white light, and an ultraviolet emitting diode may be in combination with a sapphire fluorescent plate containing a plurality of fluorescent materials to obtain white light.

According to the light emitting device of the present invention, the way of connecting the excitation light source and the fluorescent layer/sapphire fluorescent layer is not particularly limited, as long as the connection between the excitation light source and the fluorescent layer/sapphire fluorescent layer is firmly stable. For example, an adhesive may be used to bind the excitation light source on the fluorescent layer/sapphire substrate. The adhesive useful the present invention is normally selected from a transparent resin adhesive comprising, for example, an epoxy resin and a polyamide resin, and preferably, is used together with a diamond powder, aluminum nitride powder, aluminum oxide powder, or any combinations thereof Alternatively, the fluorescent layer/sapphire substrate may be fixed on the excitation light source in a manner of laminating (e.g., a fastener). In addition to the ways listed above, persons with ordinary skills in the art may adopt an appropriate connecting way as needed in practice after reviewing the context herein.

In still another embodiment of the present invention, the excitation light source in the light emitting device may be connected with a substrate with high heat conductivity to improve the heat dissipation of the light emitting device. The substrate with high heat conductivity is generally composed of a metal material, preferably, copper, aluminum or copper-aluminum alloy due to their excellent heat dissipation efficiency.

The present invention is further illustrated with the following examples. The following examples are intended for illustration only, but not to limit the scope of the present invention.

EXAMPLE

[Preparation of a Fluorescent Layer]
$BaCO_3$, $Al_2O_3$ and $SiO_2$ were weighed in a molar ratio of 2.5:1:10 and were wet milled using aluminum oxide balls for 30 minutes, and then, the obtained milled slurry was dried to obtain a precursor mixture of a calcining material. Next, a thermal treatment on the precursor mixture was performed at about 850° C. for about 4 hours to obtain a calcining material 2.5(BaO).$Al_2O_3$.10($SiO_2$).

$Y_{2.93}Al_5O_{12}$:$Ce_{0.07}$ and the obtained calcining material 2.5(BaO).$Al_2O_3$.10($SiO_2$) were weighed in a weight ratio of 40:60, ground and mixed with each other. Then, the mixture was pressed to form a green thin layer with a thickness of about 1 mm via dry pressing.

A thermal treatment was performed on the obtained green thin layer in an air atmosphere at about 1140° C. for about 2 hours to obtain a fluorescent layer F with a thickness of about 0.8 mm, as shown in FIG. 1.

[Preparation of a Sapphire Fluorescent Plate]
$BaCO_3$, $Al_2O_3$ and $SiO_2$ were weighed in a molar ratio of 2.5:1:10 and wet milled using aluminum oxide balls for 30 minutes, and then, the obtained milled slurry was dried to obtain a precursor mixture of a calcining material. Next, a thermal treatment on the precursor mixture was performed at about 850° C. for about 4 hours to obtain a calcining material 2.5(BaO).$Al_2O_3$.10($SiO_2$).

$Y_{2.93}Al_5O_{12}$:$Ce_{0.07}$ and the obtained calcining material 2.5(BaO).$Al_2O_3$.10($SiO_2$) were weighed in a weight ratio of 36:64, ground and mixed with each other. Then, the mixture was pressed to form a green thin layer with a thickness of about 1 mm via dry pressing.

The obtained green thin layer was placed on a sapphire substrate with a thickness of 0.425 mm, and a thermal treatment was performed on the green thin layer and the sapphire substrate in an air atmosphere at about 1250° C. for about 2 hours to obtain a sapphire fluorescent plate A with a fluorescent layer that has a thickness of about 0.8 mm, as shown in FIG. 2.

[Preparation of a Light Emitting Device]
*Light emitting device I*
The sapphire fluorescent plate A was fixed on a blue light LED (gallium nitride diode) to obtain a light emitting device I, as shown in FIG. 4.

Figure 5:
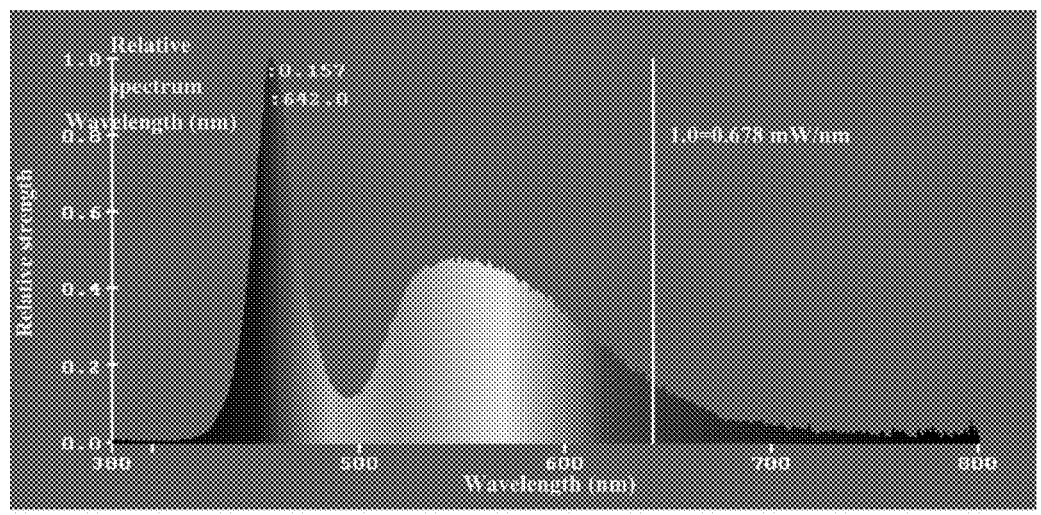
FIG. 5 is a luminescence spectrum of the light emitting device I according to the example of the present invention.
Figure 6:
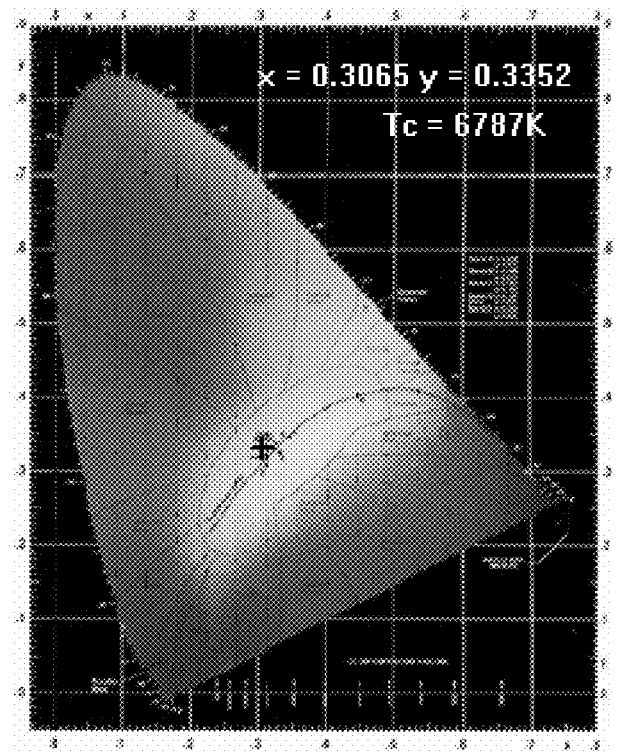
FIG. 6 is a transformed CIE coordinate diagram of the light emitting device I according to the example of the present invention.

A UV-visible-nearIR spectrum analyzer (Model PMS-80, EVERFINE Co., Ltd., Hangzhou, China) was used to test the luminescence spectrum of the light emitting device I under a 3 V voltage and 0.2 A current. The result is shown in FIG. 5. It can be seen from FIG. 5 that the luminescence spectrum of the light emitting device I mainly consists of a narrow peak of wavelength of about 460 nm (blue light) and a broad peak of wavelength of about 560 nm (yellow light). The mixing result of the light emitting device I was obtained by transforming the results in FIG. 5 to Commission Internationale de i'Eclairage (CIE) coordinate diagram (see FIG. 6), obtaining a white light at x=0.3065 and y=0.3352. It is therefore shown that the sapphire fluorescent plate of the present invention can replace the traditional fluorescent material package and obtain white light.

The above examples are used to illustrate the principle and efficacy of the present invention and show the inventive features thereof People skilled in this field may proceed with a variety of modifications and replacements based on the disclosures and suggestions of the invention as described without departing from the principle and spirit thereof Therefore, the scope of protection of the present invention is that as defined in the claims as appended.

What is claimed is:
1. A method for manufacturing a fluorescent layer, comprising:
   mixing a fluorescent material and a calcining material to form a green thin layer, wherein the fluorescent material is used in an amount ranging from about 5 wt % to about 95 wt % based on a total weight of the green thin layer; and performing a thermal treatment on the green thin layer at a temperature around an eutectic point of the calcining material, wherein the fluorescent material is $Y_{3-x}Al_5O_{12}:Ce_x$ ($0<x\leq0.5$) and the calcining material is $a(BaO).Al_2O_3.b(SiO_2)$ ($2\leq a\leq3$ and $9\leq b\leq11$).

2. The method of claim 1, wherein the fluorescent material is used in an amount ranging from about 20 wt % to about 70 wt % based on a total weight of the green thin layer.

3. The method of claim 1, wherein the thermal treatment on the green thin layer is performed in an air atmosphere or reducing atmosphere at a temperature ranging from about 1000° C. to about 1300° C.

4. A method for manufacturing a sapphire fluorescent plate, comprising:

providing a sapphire substrate;

mixing a fluorescent material and a calcining material to form a green thin layer, wherein the fluorescent material used is in an amount ranging from about 5 wt % to about 95 wt % based on a total weight of the green thin layer; and placing the green thin layer on the sapphire substrate and performing a thermal treatment on the green thin layer and the sapphire substrate at a temperature around an eutectic point of the calcining material, wherein the fluorescent material is $Y_{3-x}Al_5O_{12}:Ce_x$ ($0<x\leq0.5$) and the calcining material is $a(BaO).Al_2O_3.b(SiO_2)$ ($2\leq a\leq3$ and $9\leq b\leq11$).

5. The method of claim 4, wherein the fluorescent material used is in an amount ranging from about 20 wt % to about 70 wt % based on a total weight of the green thin layer.

6. The method of claim 4, wherein the thermal treatment on the green thin layer and the sapphire substrate is performed in an air atmosphere or reducing atmosphere at a temperature ranging from about 1000° C. to about 1300° C.

* * * * *